United States Patent [19]

Furrer et al.

[11] Patent Number: 4,510,457

[45] Date of Patent: Apr. 9, 1985

[54] SWITCHING AMPLIFIER

[75] Inventors: Andreas Furrer, Turgi; Johann Milavec, Windisch, both of Switzerland

[73] Assignee: BBC Brown, Boveri & Company, Limited, Baden, Switzerland

[21] Appl. No.: 456,977

[22] Filed: Jan. 10, 1983

[30] Foreign Application Priority Data

Jan. 11, 1982 [CH] Switzerland .......................... 116/82

[51] Int. Cl.³ ............................................ H03F 3/387
[52] U.S. Cl. ...................................... 330/10; 330/251
[58] Field of Search ...................... 330/10, 207 A, 251

[56] References Cited

U.S. PATENT DOCUMENTS 4,369,409 1/1983 Kyrian et al. ......................... 330/10

Primary Examiner—James B. Mullins
Attorney, Agent, or Firm—Oblon, Fisher, Spivak, McClelland & Maier

[57] ABSTRACT

A switching amplifier including a plurality of switching stages, each having a drive transformer, the primary winding of which is separated from the secondary winding in a manner such that no conductive connection exists between them. The primary windings of each drive transformer is connected by means of controllable switching elements to a supply-voltage source in a push-pull circuit arrangement. The switching elements are controlled by means of a signal converter which converts an analog input signal into at least one pulse sequence which is applied to the control electrodes of the controllable switching elements by means of at least one control transformer having at least one primary winding coupled to the pulse sequence and plural secondary windings coupled to the control electrode of a respective switching element. The output terminals of the secondary winding of the drive transformer are connected to a full-wave rectifier. The push-pull circuit arrangement and the full-wave rectifier enable the switching stages to operate at a power output of virtually 100%.

6 Claims, 3 Drawing Figures

SWITCHING AMPLIFIER

BACKGROUND OF THE INVENTION

1. Field of the Invention

The present invention relates to a switching amplifier, containing a signal converter which converts an analog input signal into at least one sequence of pulses, and two or more switching stages, each possessing a drive transformer, wherein the primary winding of each drive transformer is connected by means of two or more controllable switching elements to a supply-voltage source, and the secondary winding of the drive transformer is separated from the primary winding in a manner such that no conductive connection exists between them, as well as containing a control transformer for the switching elements, wherein the primary winding of the control transformer is connected to the signal converter and its secondary windings are connected to the control electrodes of respective switching elements, wherein the supply-voltage input terminals of the switching stages, on the primary side are parallel-connected to the same supply-voltage source and the signal-output terminals, on the secondary side, are series-connected by means of rectifier assemblies, and further containing a low-pass filter, which is connected to the series-connected circuit-assembly, from the free end of which filter the amplifier output is derived.

2. Description of the Prior Art

Switching amplifiers of the type described above exhibit the high efficiency of the Class D amplifiers, and due to the fact, in the switching stages, the secondary winding is separated from the primary winding in a manner such that no conductive connection exists between them, and due to the fact that the output terminals of the switching stages are series-connected, these switching amplifiers facilitate the generation of high-power output signals at very high voltages. For example, a switching amplifier is described in German Offenlegungsschrift No. 2,935,445, which is designed as a modulating amplifier for a radio-station transmitter with an output power in the region of 250 kw.

On account of the saturation of the transformer, the permissible pulse duty factor of each switching stage is, at most, 1:1, which corresponds to a power output of 50%. In the switching amplifier described, each two switching stages accordingly form an amplifier channel, in which the switching elements and transformers of the switching stages are alterately switched, or excited, this alternate switching/excitation enabling the amplifier channel to operate at a power output of 100%. For this purpose, the analog input signal is converted into one or more pairs of pulse-sequences, the two pulse-sequences of each pair being composed of duration-modulated pulses, and being phase-shifted by 180°, and each switching stage is controlled by one of these pulse-sequences. In switching amplifiers with a plurality of amplifier channels, it is possible to trigger mutually corresponding switching stages in parallel, or a plurality of oppositely phase-shifted pairs of pulse-sequences can be generated, and the switching amplifiers of each channel are controlled by a pair of pulse-sequences assigned thereto. It is self-explanatory that, in the operating mode described, the switching elements and the transformers of each switching stage are switched on, or excited, once during each cycle of the pulse-sequence, with switching losses arising in a manner which is unrelated to the length of time over which the switching elements and transformers are switched on or excited.

In order to reduce these switching losses, a switching amplifier has also already been proposed, in which the signal converter generates, at preset time intervals, a number of pairs of pulse-sequences which corresponds to the instantaneous value of the amplitude of the analog signal. The two pulse-sequences of each pair of pulse sequences are likewise phase-shifted through 180°, and are composed of pulses having a constant duration and a pulse duty factor corresponding to 1:1. As a result of using pulses having a maximum duration, and by "modulating" the number of the pairs of pulse-sequences, it is possible to minimize the number of occasions on which the transformers require to be switched, or excited, during each cycle of pulse-sequences, and to reduce the switching losses accordingly.

For the two switching amplifiers which have been described, it holds that the number of amplifier channels required is determined on the one hand, by the specified maximum output voltage and output power and, on the other hand, by the allowable supply voltage. In order to construct switching amplifiers with high output voltages and large power outputs, it is necessary to spend comparatively large amounts on hardware, this expenditure being virtually doubled by the need for each amplifier channel to contain two switching stages.

SUMMARY OF THE INVENTION

Accordingly, one object of this invention is to provide a novel switching amplifier which, for a comparatively low expenditure on hardware, exhibits virtually the same characteristics as the switching amplifiers known to date.

This object is achieved, according to the invention, with a switching amplifier of the type initially mentioned, wherein, for each drive transformer, the primary welding is connected to the switching elements which are assigned to it, to form a push-pull circuit arrangement, and the rectifier assembly at the output terminal of the secondary winding is designed as a full-wave rectifier.

The push-pull circuit arrangement enables the primary winding of the drive transformer to operate, during successive half-cycles, at power outputs of up to 100%, and hence to apply power to the drive transformer in both the forward and reverse directions. In addition, the full-wave rectifier enables the voltage, and the corresponding current, induced in the secondary winding during the two half-cycles, to be led onward to the series-connected circuit assembly. By this means, a single switching stage can take over the function of the two switching stages which were used in the amplifier stages customarily employed to date, which leads to the result that it is possible to halve the number of switching stages required for specified maximum output voltage and output power, and hence, in particular, to halve the number of transformers.

The push-pull circuit arrangement can be designed, in a simple manner, as a center-tap circuit with two switching elements which can be excited alternately or as a bridge circuit with two pairs of interacting switching elements, these pairs of switching elements being provided in order to conduct the current through the transformer in opposite directions, wherein the switching elements, of each of these pairs, which are conductive in the same direction are excited alternately.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
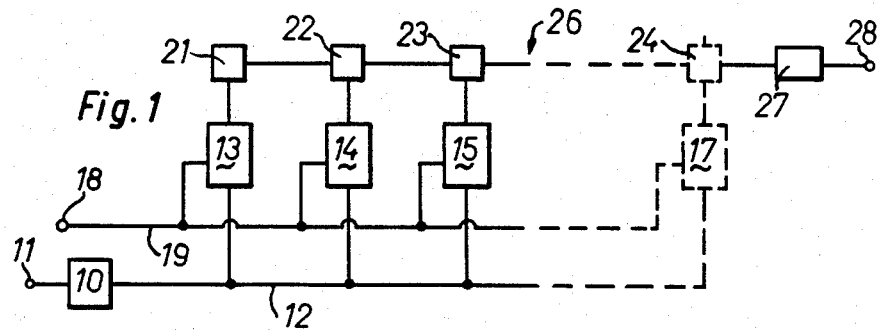
FIG. 1 is a schematic diagram of a switching amplifier with a plurality of switching-stage channels.

Referring now to the drawings, wherein like reference numerals designate identical or corresponding parts throughout the several views, the basic construction of a switching amplifier with a plurality of switching stages is shown in FIG. 1. The switching amplifier contains a signal converter 10, the input terminal of which is connected to the signal-input terminal 11 of the amplifier, and the output terminal of which in connected, by means of a line 12, to the control signal input terminals of a plurality of switching stages 13, 14, 15, 17. The switching amplifier further contains a supply-voltage terminal 18 and a line 19, which possesses branches and connects this terminal to the supply-voltage input terminals of the switching stages. Each switching stage contains a drive transformer, it being possible to connect the primary winding of this drive transformer, by means of one or more controllable switching elements, to a supply-voltage input terminal. This primary winding is separated from the secondary winding in a manner such that no conductive connection exists between them. The output terminal of each switching stage is connected to a respective rectifier assembly 21, 22, 23, 24. These assemblies form a series-connected circuit-assembly 26, which is connected to the input terminal of a low-pass filter 27. The output terminal of this filter is connected to the signal-output terminal 28 of the switching amplifier.

In order to operate this switching amplifier, the supply-voltage terminal 18 is connected to a source of direct current, and the analog signal which is to amplified is led to the signal-input terminal 11. The analog signal is then converted, in the signal converter 10, into one or more pulse-sequences, the pulses of which control the switching elements in the switching stages 13, 14, 15, 17. At the same time, a surge of current flows, during the duration of each pulse, through the primary winding of the drive transformer. The voltage, and the corresponding current, concurrently induced in the secondary winding of the drive transformer of each switching stage, are output via the series-conected circuit-assembly 26, in which voltage-surges which appear simultaneously or which are partially superimposed are added. The signal at the end of the series-connected circuit assembly, corresponding to the sum of the added voltage-surges, is smoothed in the low-pass filter 27, and then appears, as an amplified analog signal, at the output terminal 28.

A proven embodiment of the known switching amplifiers, and illustrative embodiments of the signal converter, of the switching stages, and of the low-pass filter are comprehensively described and illustrated in German Offenlegungsschrift No. 2,935,445, incorporated by reference herewith, which has already been cited, for which reason a detailed description of these subassemblies is dispensed with here. Also, see related commonly owned U.S. Ser. No. 377,012 filed May 11, 1982, now abandoned.

Figure 2:
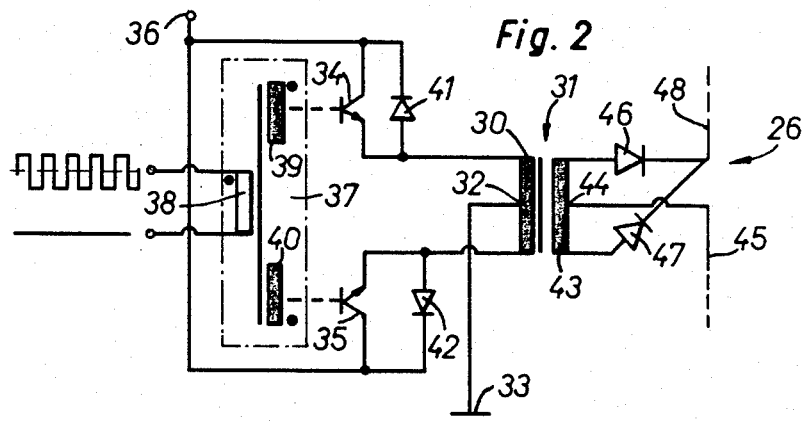
FIGS. 2 and 3 are block circuit diagrams of various embodiments of switching stages with a push-pull circuit arrangement on the input side, and a full-wave rectifier on the output side.

FIG. 2 shows a simple embodiment of a switching stage, in which the primary winding of the drive transformer, together with the switching elements, forms a push-pull center-tap circuit, and the output terminal of the secondary winding is connected to a two-pulse center-tap circuit. For this purpose, the primary winding 30 of the drive transformer 31 possesses a center tap 32, which is connected to the ground line 33 of the amplifier, or to the negative terminal of the supply-voltage source. The two ends of the primary winding are respectively connected to the emitters of switching transistors 34 and 35 assigned thereto. The collectors of these switching transistors are connected to the supply-voltage input terminal 36. In addition, a control transformer 37 is provided, its primary winding 38 being connected to the control-signal line, and its secondary windings 38, 40, which are separated in a manner such that no conductive connection exists between them, delivering the switching control signals for the transistors respectively. A protective diode, 41 or 42, is respectively assigned to each switching transistor, this diode being polarized in the opposite direction relative to the respective switching transistor. While only one control transformer is shown, clearly plural control transformers can be used for the various switching stages, or a single transformer having plural control windings can alternately be used.

The secondary winding 43 of the drive transformer 31 likewise posesses a center tap 44, which is connected to one leg 45 of the series-connected circuit-assembly 26. Each of the two ends of the secondary winding is connected to the other leg 48 of the series-connected circuit-assembly via respective diodes 46, 47.

In order to describe the mode of operation of this switching stage, it may be assumed that double-sided control pulses are led, from the signal converter 10 on one of the control-signal lines, to the primary winding 38 of the control transformer 37, the other line being connected to the equipment-ground. The windings of the control transformer 37 are arranged in such a manner that, when a positive switching pulse occurs in the primary winding 38, a positive switching pulse can be picked-off at the secondary winding 39, and a negative switching pulse can be picked-off at the secondary winding 40. When a positive signal pulse occurs, the transistor 34 is then switched into the conductive state, and the transistor 35 is blocked, and current flows from the supply-voltage input terminal 36, through the top portion (as shown in FIG. 2) of the primary winding 32, and thence to the ground line 33. When the subsequent negative control pulse occurs, the transistor 34 is blocked, and the transistor 35 is switched into the conductive state. Current then flows from the supply-voltage input terminal 36, through the transistor 35 and the bottom portion (as shown in FIG. 2) of the primary winding 30 of the transformer 31 leading to the center tap 32, and thence to the ground line. The positive voltage-surge, and the corresponding current-surge, induced in the corresponding portion of the secondary winding 43 during each period over which current flows in a portion of the primary winding 30, are led away to the other portion 48 of the series-connected circuit-assembly 26, via one of the rectifiers, 45 or 47.

The voltage-peaks which, when the current through one of the portions of the primary winding 30 of the transformer 31 is interrupted, are induced in the other portion of this winding, are led away via the diodes 41 and 42.

Figure 3:
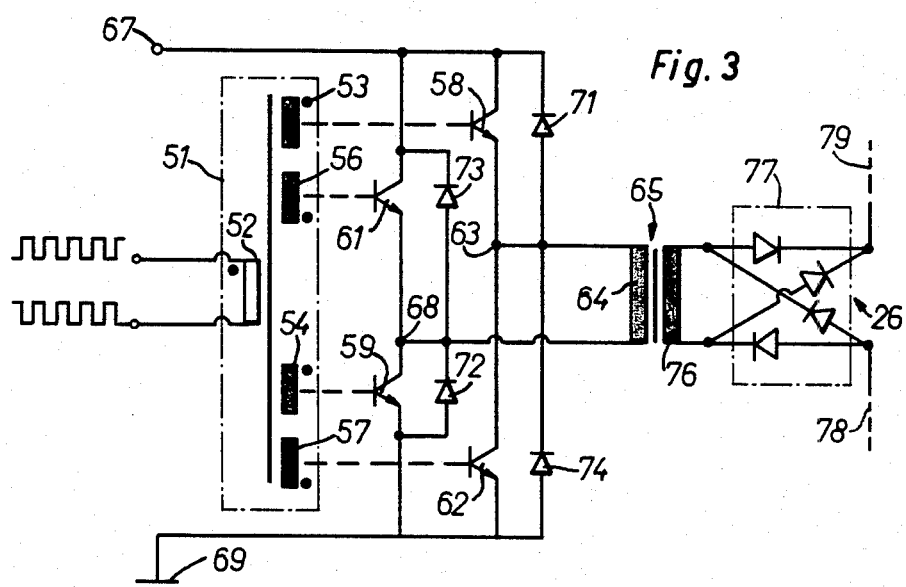

In the embodiment of a switching stage shown in FIG. 3, the primary winding 64 of the drive transformer 65 is connected to the switching elements assigned thereto, to form a push-pull bridge circuit, and the secondary winding 76 of the drive transformer 65 is connected to the series-connected circuit-assembly via a rectifier bridge 77. The control transformer 51 of this switching stage possesses a primary winding 52, the ends of which are connected to the signal line 12, as well as four secondary windings 53, 54 and 56, 57, which are assigned, one to another, in pairs, and which are all separated from each other in a manner such that no conductive connection exists between them. The switching-pulse output terminals of the paired secondary windings 53, 54 and 56, 57 are respectively connected to the switching transistors 58, 59 and 61, 62, which interact, in a paired arrangement, with the control electrodes. One of the pairs of switching transistors, 58, 59, is provided in order to effect a current-conducting connection between one of the terminals 63 of the primary winding 64 of the drive transformer 65 and the supply-voltage input terminal 67, and between the other terminal 68 of the primary winding and the equipment-ground 69, while the other pair of switching transistors, 61, 62, is provided in order to effect a current-conducting connection between the other terminal 68 of the primary winding 64 and the supply-voltage input terminal 67, and between the terminal 63 and the equipment-ground 69. Protecting diodes 71, 72, 73 and 74 are connected in anti-parallel relation with respect to respective switching transistors 58, 59, 61 and 62.

The secondary winding 76 of the drive transformer 65 is connected to the legs 78, 79 of the series-connected circuit-assembly 26 via a bridge-connected rectifier 77.

In order to describe the mode of operation of this switching stage, it may be assumed that single-sided control pulses, which are phase-shifted through 180°, are led to the two terminals of the primary winding 52 of the control transformer 51, and that the windings are arranged in such a manner that each signal pulse which is led to the primary winding generates a switching pulse of the same polarity in each of the paired secondary windings, and generates switching pulses of opposite polarity in each pair of secondary windings. Then, during the duration of a positive pulse on one of the lines leading to the primary winding, (on the upper line as shown in FIG. 3), a positive switching pulse appears at the input terminals to the paired secondary windings 53, 54, while a negative switching pulse appears at the secondary windings 56, 57, which are likewise paired. These switching pulses switch the interacting transistors 58, 59 into the conductive state, and switch the transistors 61, 62, which likewise interact, into the blocked state. Current then flows from the supply-voltage input terminal, through the switching transistor 58, from the terminal 63, through the primary winding 64 of the transformer, to the terminal 68 and, through the switching transistor 59, to the equipment-ground 69. During the duration of a subsequent positive control pulse on the other line leading to the primary winding (the lower line, as shown in the Figure), a negative switching pulse appears at the output terminals of the secondary windings 53, 54, while a positive switching pulse appears at the output terminals of the secondary windings 56, 57. These pulses switch the transistors 58, 59 into the blocked state, and switch the transistors 61, 62 into the conductive state. Current then flows from the supply-voltage input terminal 67, through the transistor 61, from the terminal 68, through the primary winding 64 of the transformer, to the terminal 63 and, through the transistor 62, to the equipment-ground 69.

The current flowing, during the duration of the control pulses, or switching pulses, in alternating directions through the primary winding 64 of the transformer, induces corresponding voltage-surges in the secondary winding 66, the current-surges associated with these voltage-surges being led, by the bridge-connected rectifier, to one or the other of the legs 78 and 79 of the series-connected circuit-assembly 26, in accordance with their polarity.

In this embodiment too, the voltage-peaks, arising as the current in the primary winding is interrupted, are led away via the diodes 71, 72 or 73, 74.

In this embodiment, the switching transistors, which are series-connected and which interact in a paired manner, make it possible to switch a supply-voltage for the primary winding of the transformer 65 which is equal to twice the supply-voltage employed in the embodiment according to FIG. 2.

The switching stages which have been described can be constructed with commercially available components, for which reason the description of these components is expressly dispensed with here. It is also assumed that the optimum selection and sizing of the components for switching stages with prescribed characteristics lies within the scope of the ability of persons skilled in the art, and requires no explanation.

It is self-explanatory that the two switching stages, which have been described by way of examples, are capable of being modified in a multiplicity of ways, and that it is also possible to use switching stages which have been constructed differently. For example, it is possible, in the case of the embodiment according to FIG. 2, to connect the secondary winding of the drive transformer, by means of a bridge-connected rectifier, to the series-line, and, conversely, in the case of the embodiment according to FIG. 3, to use a two-pulse center-tap circuit arrangement for the connection between the secondary winding of the drive transformer and the series-line. It is also self-explanatory that, instead of the sequences of control pulses which have been shown by way of example, it is possible to use any other pulse-sequences which are suitable for operating a switching amplifier, without thereby altering the mode of operation of the switching stages as described.

Finally, it is self-explanatory that, in the switching stages which have been described, by way of example, in FIGS. 2 and 3, the respective connections for the supply-voltage and for the ground-line are interchangeable, provided that suitable switching transistors and protective diodes are connected in an appropriate manner.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A switching amplifier comprising:
   a signal converter adapted to convert an analog input signal into at least one pulse sequence;
   at least two switching stages each comprising,
   at least one control transformer having at least one primary winding coupled to said at least one pulse sequence, and plural secondary windings;
   plural controllable switching elements each adapted to be coupled to a supply voltage source and each having a respective control electrode coupled to a respective secondary winding of said control transformer;
   a drive transformer having a primary winding connected in circuit with at least two of said switching elements to connect the drive transformer primary winding in push-pull sequence with said supply voltage source in accordance with said at least one pulse sequence, and a secondary winding separated from said drive transformer primary winding such that no conductive connection exists therebetween; and
   a rectifier assembly comprising a full wave rectifier coupled to the secondary winding of said drive transformer;
   wherein each switching stage is parallel connected via the primary winding circuit of said drive transformer to said supply voltage source, and the rectifier assemblies of said switching stages are connected in series; and
   a low pass filter connected in series with said rectifier assemblies for filtering a signal generated by said series connected rectifier assemblies, wherein the filtered signal corresponds to the amplified output signal of said switching amplifier.

2. A switching amplifier according to claim 1, wherein said primary winding of said drive transformer comprises a center tap, and two switching elements are alternatively excited by said pulse sequence to apply said supply voltage source in push-pull sequence to the opposed ends of said drive transformer primary winding.

3. A switching amplifier according to claim 1, wherein each switching stage comprises two pairs of switching elements, each pair of which is connected in opposite polarity in series with the primary winding of said drive transformer, the pairs of switching elements being alternatively excited by said pulse sequence to apply said supply voltage source to said primary winding of said drive transformer in push-pull sequence.

4. A switching amplifier, acording to claim 1, comprising:
   a diode connected in anti-parallel relation to each switching element.

5. A switching amplifier, according to claim 1, wherein said drive transformer comprises a center-tapped secondary winding, and the full-wave rectifier comprises a pair of rectifiers connected to opposite ends of said center-tapped secondary winding to produce a push-pull rectifier.

6. A switching amplifier according to claim 1, wherein the full-wave rectifier comprises a bridge-connected rectifier.

* * * * *